United States Patent
Tanaka et al.

(10) Patent No.: US 7,567,021 B2
(45) Date of Patent: Jul. 28, 2009

(54) MONOMORPH TYPE PIEZOELECTRIC/ELECTROSTRICTIVE DEVICE AND METHOD FOR MANUFACTURING THE SAME

(75) Inventors: Ritsu Tanaka, Nagoya (JP); Hirofumi Yamaguchi, Komaki (JP); Yukinobu Yura, Nagoya (JP); Shuichi Ozawa, Nagoya (JP)

(73) Assignee: NGk Insulators, Ltd., Nagoya (JP)

( * ) Notice: Subject to any disclaimer, the term of this patent is extended or adjusted under 35 U.S.C. 154(b) by 0 days.

(21) Appl. No.: 11/850,710

(22) Filed: Sep. 6, 2007

(65) Prior Publication Data

US 2008/0074007 A1    Mar. 27, 2008

(30) Foreign Application Priority Data

Sep. 26, 2006   (JP)   .............................. 2006-261030
Mar. 23, 2007   (JP)   .............................. 2007-077662

(51) Int. Cl.
*H01L 41/08*   (2006.01)
(52) U.S. Cl. ........................................ 310/330; 310/358
(58) Field of Classification Search .................. 310/328, 310/332, 330, 357, 358
See application file for complete search history.

(56) References Cited

U.S. PATENT DOCUMENTS 4,533,849 A * 8/1985 Schnell ........................ 310/330
5,461,274 A * 10/1995 Yuji et al. .................... 310/330
5,589,727 A * 12/1996 Seward ...................... 313/231.31
7,019,438 B2 * 3/2006 Takahashi et al. ........... 310/332

FOREIGN PATENT DOCUMENTS

JP         04-239187 A1      8/1992

* cited by examiner

*Primary Examiner*—Quyen Leung
*Assistant Examiner*—Karen B Addison
(74) *Attorney, Agent, or Firm*—Burr & Brown

(57) ABSTRACT

A monomorph type piezoelectric/electrostrictive device includes a piezoelectric/electrostrictive body, which is composed of a non-lead based piezoelectric/electrostrictive crystalline body containing at least Nb, Ta, and one or more types of alkali metal element, which has a cubic crystal structure at a temperature higher than the phase transition point and at least any one of tetragonal and orthorhombic crystal structures at a temperature lower than the phase transition point, and which is curved to a large extent by a polarization treatment to take on a curved shape at a temperature lower than the phase transition point without application of a voltage after the polarization treatment. In the polarization treatment, an electric field is increased at a speed of from 0.1 (kV/mm)/sec or more to 5 (kV/mm)/sec or less, with applying the maximum electric field of from 2 kV/mm or more to 1.0 kV/mm or less.

4 Claims, 3 Drawing Sheets

MONOMORPH TYPE PIEZOELECTRIC/ELECTROSTRICTIVE DEVICE AND METHOD FOR MANUFACTURING THE SAME

BACKGROUND OF THE INVENTION

1. Field of the Invention

The present invention relates to a monomorph type piezoelectric/electrostrictive device and a method for manufacturing the same.

2. Description of the Related Art

Heretofore, piezoelectric/electrostrictive devices have been known as elements capable of controlling a micro displacement of the order of submicrons. In particular, piezoelectric/electrostrictive devices, in which a piezoelectric/electrostrictive portion composed of a piezoelectric/electrostrictive ceramic composition (hereafter may simply be referred to as "piezoelectric ceramic") and electrode portions to be applied with a voltage are laminated on a ceramic substrate, are suitable for controlling a micro displacement and, in addition, have excellent characteristics, for example, a high electromechanical conversion efficiency, high-speed responsivity, high durability, lower power consumption. These piezoelectric/electrostrictive devices are used in various applications, for example, piezoelectric pressure sensors, probe drive mechanisms of scanning tunneling microscopes, rectilinear guide mechanisms of ultraprecision machining apparatuses, hydraulic control servo valves, video tape recorder heads, pixels in flat-panel image display apparatuses, ink-jet printer heads, and the like.

Various studies have also been conducted on the piezoelectric ceramic constituting the piezoelectric/electrostrictive portion. For example, in recent years, there is a tendency to perceive influences exerted on the global environment, such as, elution of lead (Pb) by an acid rain, as problems. Therefore, (Li,Na,K) (Nb,Ta)O$_3$ based piezoelectric ceramic capable of providing a piezoelectric/electrostrictive body or a piezoelectric/electrostrictive device, which exhibit satisfactory piezoelectric/electrostrictive characteristics even when lead (Pb) is not contained, has been developed as a piezoelectric/electrostrictive material in consideration of the influence exerted on the environment.

Since the piezoelectric ceramic is a ferroelectric substance, a polarization treatment must be conducted in order to take advantage of the properties (piezoelectric characteristics) by incorporating the piezoelectric ceramic into an electronic device or the like. This polarization treatment refers to a treatment of aligning the direction of the spontaneous polarization in a specific direction by applying a high voltage, and the treatment is conducted by, for example, applying a voltage to the piezoelectric ceramic under an appropriate temperature condition. That is, a plurality of domains are present in the ferroelectric substance due to uneven distribution of electric charges by the spontaneous polarization, and the piezoelectric ceramic is subjected to the polarization treatment of aligning the direction of domains of ferroelectric substance in a predetermined direction.

Some piezoelectric/electrostrictive devices made of the piezoelectric ceramic have a force of constraint oil one surface by being joined with a different type of material such as a metal plate. In such a piezoelectric/electrostrictive device, cracks are generated in a sintered body during firing for being joined to the different type of material, due to the difference in thermal expansion coefficient between the piezoelectric material and the metal plate. Furthermore, the temperature is increased by heat generation of the piezoelectric ceramic during use, and cracking occurs due to difference in thermal expansion coefficient between the piezoelectric material and the metal plate, therefore the characteristics deteriorate.

There is disclosed a monomorph type actuator in which the composition in the thickness direction is changed continuously so as to become a gradient material exhibiting continuously varying characteristics (See JP-A-4-239187).

However, several types of powders having different compositions must be prepared in order to produce a compositionally gradient material and, thereby, the production costs tend to be increased.

SUMMARY OF THE INVENTION

Accordingly, a monomorph type piezoelectric/electrostrictive device has been desired, in which an increase in production cost is prevented without joining to a different type of material nor using a compositionally gradient material. It is an object of the present invention to provide a monomorph type piezoelectric/electrostrictive device including a non-lead based piezoelectric/electrostrictive polycrystalline body and a method for manufacturing the same.

In order to solve the above-described problems, according to the present invention, there is provided a monomorph type piezoelectric/electrostrictive device including a non-lead based piezoelectric/electrostrictive crystalline body containing at least Nb, Ta, and one or more types of alkali metal element, wherein the piezoelectric/electrostrictive crystalline body has a cubic crystal structure at a temperature higher than the phase transition point and at least any one of tetragonal and orthorhombic crystal structures at a temperature lower than the phase transition point, and wherein the piezoelectric/electrostrictive crystalline body shows a curved shape having a degree of curving larger than that before a polarization treatment at a room temperature lower than the phase transition point, when the piezoelectric/electrostrictive crystalline body is subjected to the polarization treatment.

And the piezoelectric/electrostrictive body is different in the distortion factor between a first main surface which is an end surface in the thickness direction and a second main surface opposite to the first main surface.

In order to solve the above-described problems, according to the present invention, there is provided a method for manufacturing the above-described monomorph type piezoelectric/electrostrictive device including which includes the step of subjecting the piezoelectric/electrostrictive body to a polarization treatment wherein the maximum electric field is applied, with increasing an electric field at an electric field increasing speed of from 0.1 (kV/mm)/sec or more to 5 (kV/mm)/sec or less while keeping a maximum electric field at level of from 2 kV/mm or more to 10 kV/mm or less.

A monomorph type piezoelectric/electrostrictive device according to the present invention takes on a curved shape after a polarization treatment without joining to a different type of material or being made into a compositionally gradient material. Since joining to a different type of material is not conducted, cracks due to the difference in thermal expansion coefficient are not generated. Furthermore, since a compositionally gradient material is not used, production is conducted easily.

DESCRIPTION OF REFERENCE NUMERALS

Figure 1:
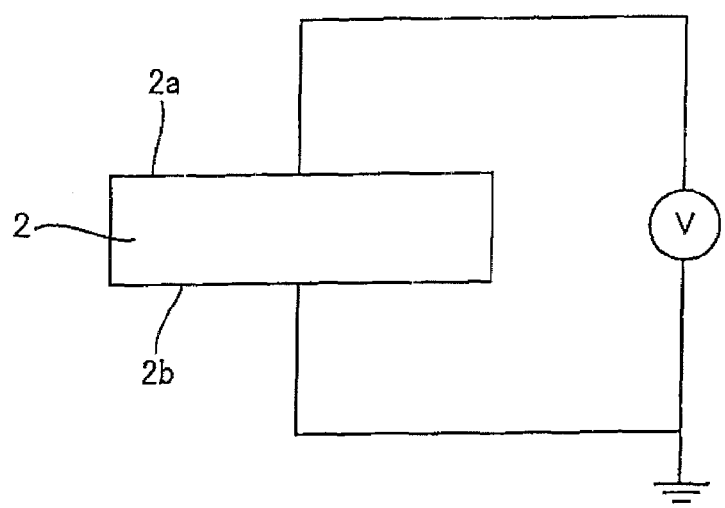
FIG. 1 is an explanatory diagram for explaining a polarization treatment.

1: piezoelectric/electrostrictive device, 2: piezoelectric/electrostrictive body (piezoelectric/electrostrictive portion), 2a: first main surface (polarization positive surface), 2b: second main surface (polarization ground surface), 4,5: electrode, 52: piezoelectric/electrostrictive device

DESCRIPTION OF THE PREFERRED EMBODIMENTS

The embodiments according to the present invention will be described below with reference to the drawings. The present invention is not limited to the following embodiments, and can, be modified, corrected, or improved within the scope of the invention.

In the present specification, the term "piezoelectric/electrostrictive ceramic composition (piezoelectric ceramic)" refers to a piezoelectric/electrostrictive material which is used for forming a piezoelectric/electrostrictive portion (piezoelectric/electrostrictive body) and which exhibits piezoelectric/electrostrictive characteristics by being subjected to a polarization treatment.

This piezoelectric/electrostrictive ceramic composition is a, non-lead based piezoelectric/electrostrictive crystalline body containing at least Nb, Ta, and one or more types of alkali metal element and is a ceramic material having a crystal structure in which reversible phase transition between cubic, tetragonal, and orthorhombic crystal structures can occur at the phase transition points. More specifically, the piezoelectric/electrostrictive ceramic composition is the cubic crystal under a high-temperature condition, and as the temperature is decreased, a change from the cubic crystal to the tetragonal crystal occurs at a first phase transition point. As the temperature is further decreased, the phase transition from the tetragonal crystal to the orthorhombic crystal occurs at the second phase transition point.

The piezoelectric/electrostrictive portion constituting the piezoelectric/electrostrictive device, as described later, is formed by a polarization treatment in which an electric field (voltage) is applied to a piezoelectric/electrostrictive body prepared by firing the piezoelectric/electrostrictive ceramic composition in a temperature range lower than the first phase transition point, at which the crystal structure is changed from the cubic crystal to the tetragonal crystal, and at a predetermined increase rate. Though depending on its composition, usually, the first phase transition point of the piezoelectric/electrostrictive body is 250° C. to 450° C., and the second phase transition point, at which the crystal structure changes from the tetragonal crystal to the orthorhombic crystal occurs, is −30° C. to 150° C. Since the piezoelectric/electrostrictive portion of the monomorph type piezoelectric/electrostrictive device according to the present invention has been subjected to the polarization treatment in which the electric field has been increased at the predetermined increase rate within the predetermined temperature range lower than the first phase transition point, excellent piezoelectric/electrostrictive characteristics are exhibited.

The composition of the piezoelectric/electrostrictive body constituting the monomorph type piezoelectric/electrostrictive device according to the present invention is not specifically limited insofar as the piezoelectric/electrostrictive body is prepared by firing the piezoelectric/electrostrictive ceramic composition which has the cubic crystal structure at a temperature higher than the phase transition point and at least any one of the tetragonal crystal structure and the orthorhombic crystal structure at a temperature lower than the phase transition point and in which spontaneous polarization occurs. Specific examples of the piezoelectric/electrostrictive bodies include those represented by the following general formula (1) and produced by mixing compounds, each containing Nb, Ta, ox an alkali metal element.

$$A_1(Nb_xTa_y)O_{3-\delta} \quad (1)$$

(In the above-described general formula (1), A represents at least one kind of alkali metal element selected from the group consisting of Li, Na, and K, and $0.7 \leq (x+y) < 1.0$ is satisfied.)

The mixture represented by the above-described general formula (1) is calcined and, thereby, the piezoelectric/electrostrictive ceramic composition of the present embodiment, in which the ratio (molar ratio) of the constituent metal elements is represented by a nonstoichiometric composition ratio, can be obtained. If the value of "x+y" is below 0.7, excess alkali metal element may not completely make a solid solution. As a result, other compounds tend to be formed, or carbonates and the like tend to be deposited on the sintered product surface so as to decrease the insulation resistance. On the other hand, if the value of "x+y" is 1.0 or more, the degree of derisification of the fired surface tends to be easily decreased because of deterioration of the sinterability, occurrence of idiomorphism, or the like. It is more preferable that the value of "x+y" satisfies $0.7 \leq (x+y) < 0.995$, particularly $0.90 \leq (x+y) \leq 0.99$. Most preferably, $0.95 \leq (x+y) \leq 0.99$ is satisfied.

With respect to the piezoelectric/electrostrictive ceramic composition of the present embodiment, in the above-described general formula (1), it is preferable that A is represented by the following general formula (2) and, in addition, x and y are within the range of 0<x<1 and 0<y<1, respectively. More preferably, $0.5 \leq x \leq 0.95$ and $0.05 \leq y \leq 0.5$ are satisfied.

$$Li_aNa_bK_c \quad (2)$$

(In the above-described general formula (2), $0 < a \leq 0.5$, $0 \leq b \leq 1$, and $0 \leq c \leq 1$ are satisfied.)

With respect to the piezoelectric/electrostrictive ceramic composition of the present embodiment, the B site (the site containing N) and Ta as constituent metal elements) in the above-described general formula (1) may contain transition metal elements other than Nb and Ta. Examples of transition metal elements other than Nb and Ta include V, W, Cu, Ni, Co, Fe, Mn, Cr, Ti, Zr, Mo, and Zn.

It is preferable that the piezoelectric/electrostrictive ceramic composition of the present embodiment further contains Sb, because the amount of distortion generated becomes larger, and a piezoelectric/electrostrictive device exhibiting further excellent piezoelectric/electrostrictive characteristics can be obtained. In order to produce a piezoelectric/electrostrictive ceramic composition further containing Sb, a mixture is prepared by, for example, mixing compounds containing metal elements in such a way as to satisfy the ratio (molar ratio) of the metal elements in a composition represented by the following general formula (3). The resulting mixture is calcined and, thereby, the piezoelectric/electrostrictiv ceramic composition of the present embodiment further containing Sb can be produced.

$$A_1(Nb_xTa_ySb_z)O_{3-\delta} \qquad (3)$$

(In the above-described general formula (3), A represents at least one kind of alkali metal element selected from the group consisting of Li, Na, and K, and $0.7 \leqq (x+y) < 1.0$ and $0 < z < 1$ are satisfied.)

In order to produce the piezoelectric/electrostrictive ceramic composition to be used for forming the piezoelectric/electrostrictive portion of the piezoelectric/electrostrictive device, first, compounds containing metal elements are weighed in such a way as to satisfy the ratio (molar ratio) of each of the metal elements in a composition of the piezoelectric/electrostrictive ceramic composition, and are mixed by a mixing method, such as a ball mill, so as to prepare a mixed slurry. The types of the compounds containing each of the metal elements are not particularly limited; however, oxides, carbonates, and the like of each of the metal elements are suitably used.

The resulting mixed slurry is dried by using a drier or by an operation such as filtration, and then a mixed raw material can be obtained. The resulting mixed raw material is calcined and, if necessary, pulverized and then a piezoelectric/electrostrictive ceramic composition can be obtained. Incidentally, the calcination is conducted preferably at a temperature of 750° C. to 1,000° C. Also, the grinding is preferably conducted by means of a ball mill or the like. Subsequently, the resulting piezoelectric/electrostrictive ceramic composition is subjected to, as necessary, molding into an appropriate shape, firing, processing, and formation of electrodes. Thereafter, a polarization treatment is conducted under a specific condition, as described later, and then a piezoelectric/electrostrictive portion can be produced. Incidentally, the firing is preferably conducted at a temperature of 900° C. to 1,200° C.

The average grain size of crystal grains constituting the piezoelectric/electrostrictive portion is preferably 1 to 1.5 µm. If the average grain size is below 1 µm, sometimes, domains do not grow adequately in the piezoelectric/electrostrictive portion. Therefore, the piezoelectric characteristics may deteriorate. On the other hand, if the average grain size is beyond 1.5 µm, the domains become difficult to move and the piezoelectric/electrostrictive characteristics may deteriorate as well, whereas domains grow adequately in the piezoelectric/electrostrictive portion.

Furthermore, it is preferable that the surface roughness Ra (arithmetic average roughness) is 0.2 µm or more and 1 µm or less. The polarization treatment is conducted, as described later, by using such a piezoelectric/electrostrictive body, and then a piezoelectric/electrostrictive portion, which takes on a curved structure in a state without an electric field application after the polarization treatment and which, exhibits monomorph type behavior, can be produced.

Incidentally, the piezoelectric/electrostrictive portion and the electrodes constituting the piezoelectric/electrostrictive device of the present embodiment can take on various shapes. Specifically, preferable examples thereof include the shape of a block (a so-called bulk) and the shape of a sheet (the shape of a film).

Figure 2:
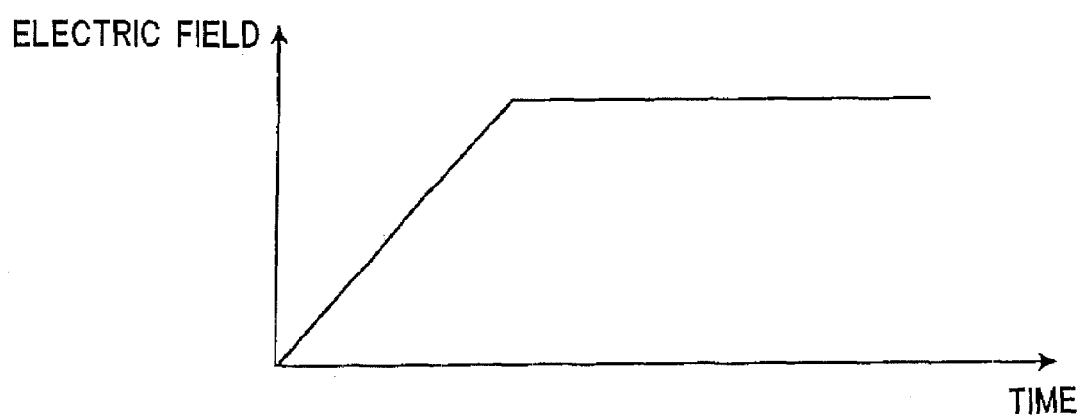
FIG. 2 is a diagram for explaining changes in an electric field to be applied.

Next, the polarization treatment of the piezoelectric/electrostrictive body to be used for forming the piezoelectric/electrostrictive portion will be described. A piezoelectric/electrostrictive body 2 is produced by firing any one of the piezoelectric/electrostrictive ceramic compositions according to the above-described embodiments of the present invention. That is, the piezoelectric/electrostrictive body 2 of the piezoelectric/electrostrictive device 1 of the present embodiment is produced by firing a piezoelectric/electrostrictive ceramic composition which contains at least Nb, Ta, and one or more types of alkali metal element and in which the ratio (molar ratio) of Nb, Ta, and the alkali metal elements is represented by a nonstoichiometric composition ratio. As shown in FIG. 1, a direct current electric field is applied to the piezoelectric/electrostrictive body 2 molded into an appropriate shape (for example, the shape of a rectangular plate) at 2 to 10 kV/nm for 15 minutes. In this case, it is preferable that the electric field increase rate is 0.1 to 5 (kV/mm)/sec. FIG. 2 shows the change in the direct current electric field applied.

The polarization treatment, in which an electric field is increased and a direct current electric field is applied under the above-described condition, can curve the piezoelectric/electrostrictive body of a rectangular plate shape. For example, with respect to a piezoelectric/electrostrictive body of a rectangular plate shape of 12 mm×3 mm×1 mm applied with a direct current electric field at 5 kV/mm for 15 minutes, the degree of curving as a curvature radius R in the 12-mm direction can be specified to be 1.8 m (the amount of warp of 10 µm) to 36 m (the amount of warp of 0.5 µm).

When the electric field increase rate is specified to be 0.1 to 5 (kV/mm)/sec, as described above, the polarization based on the polarization treatment is limited within a predetermined range from the surface, and the spontaneous polarization in the inside is not aligned in a predetermined direction, therefore the sample can be made into a curved shape.

Figure 3:
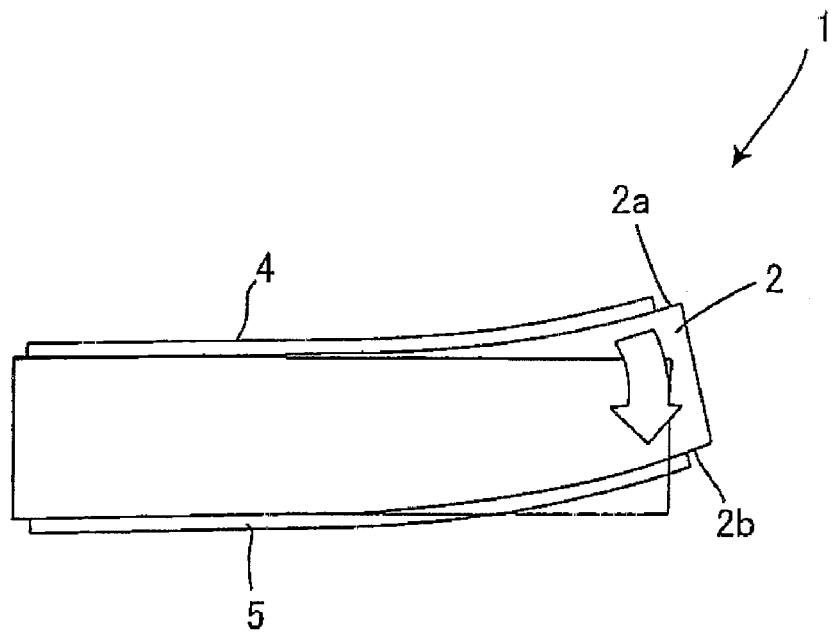
FIG. 3 is a diagram showing a monomorph type piezoelectric/electrostrictive device according to the present invention.
Figure 4:
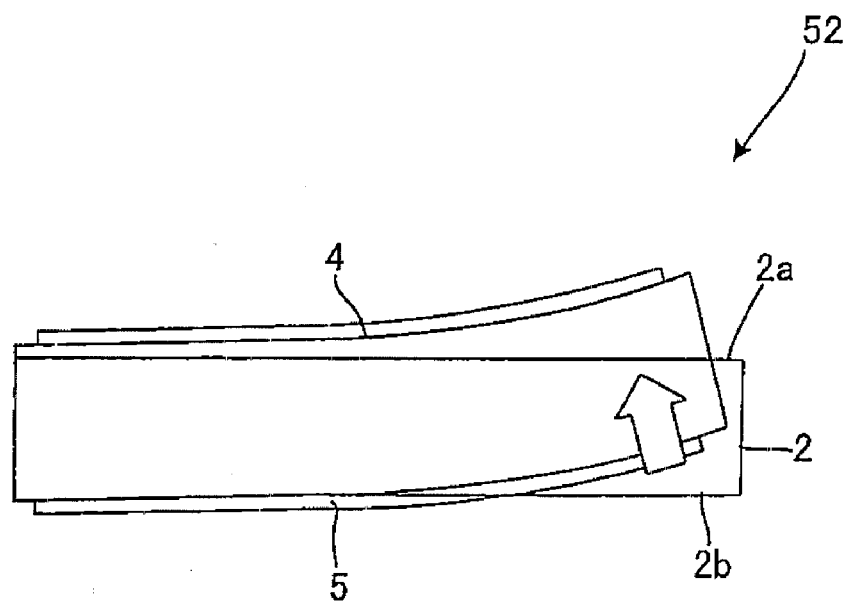
FIG. 4 is a diagram showing a known monomorph type piezoelectric/electrostrictive device.

FIG. 3 shows a piezoelectric/electrostrictive device 1, as the monomorph type piezoelectric/electrostrictive device according to the present invention. FIG. 4 shows a known piezoelectric/electrostrictive device 52. The piezoelectric/electrostrictive device 1 includes, as a piezoelectric/electrostrictive portion, the piezoelectric/electrostrictive body 2 formed on a basis of the above-described grain size, the surface roughness Ra, and the polarization treatment and electrodes 4 and 5 are respectively formed on the first main surface (polarization positive surface) 2a and the second main surface (polarization ground surface) 2b which are two end surfaces in the thickness direction of the piezoelectric/electrostrictive portion 2.

In the piezoelectric/electrostrictive device 1 of the present embodiment, examples of materials for the electrodes 4 and 5 include at least one type of metal selected from the group consisting of Pt, Pd, Rh, Au, Ag, and alloys thereof. Most of all, platinum or alloys containing platinum as a primary component is preferable because of the high heat resistance during the firing of the piezoelectric/electrostrictive portion. Also, alloys such as Ag—Pd are also suitably used from the viewpoint that the piezoelectric/electrostrictive portion is formed at lower firing temperatures.

The piezoelectric/electrostrictive device takes on, a curved shape as shown in FIG. 3, and takes on a planar shape when an electric field (voltage) is applied in the use as an element. On the other hand, as shown in FIG. 4, the known piezoelectric/electrostrictive device 52 takes on a planar shape in a steady state (a state in which an electric field is not applied), and takes on a curved shape when an electric field is applied in the use as an element. The piezoelectric/electrostrictive device 1 according to the present invention becomes a surface having a predetermined curvature in a steady state and, therefore, can be used for a focus control mechanism and the like.

EXAMPLES

The present invention will be described below in further detail with reference to the examples. However, the present invention is not limited to these examples. The methods for measuring various physical properties and methods for evaluating various characteristics will be described below.

Distortion factor (electric-field-induced distortion): A strain gauge was affixed on the electrode, and an electric field of 4 kV/mm was applied. Then the amount of distortion in a direction perpendicular to the electric field was measured as a distortion factor (electric-field-induced distortion) (ppm).

Examples 1 to 3

Predetermined amounts of $Li_2CO_3$, $C_4H_5O_6Na\cdot H_2O$, $C_4H_5O_6K$, $Nb_2O_5$, and $Ta_2O_5$ were mixed in alcohol for 16 hours to prepare a mixture. The resulting mixture was calcined at a temperature of 750° C. to 850° C. for 5 hours, followed by grinding in a ball mill, then there was prepared a piezoelectric/electrostrictive ceramic composition (phase transition point=68° C.) having a composition represented by $\{Li_y(Na_{1-x}K_x)_{1-y}\}_a(Nb_{1-z}Ta_z)O_3$ (where a=1.00 to 1.025, x=0.3 to 0.65, y=0.04 to 0.08, and z=0.082) was prepared. The resulting piezoelectric/electrostrictive ceramic composition was used and powder compacted into the size of 20 mm diameter×6 mm thickness at a pressure of 2 t/cm² to obtain a powder compact. The resulting powder compact was put into an alumina container, and was fired at a temperature of 900° C. to 1,200° C. for 3 hours to obtain a fired body. The resulting fired body was processed into the size of 12 mm×3 mm×1 mm. The average grain size of the fired body was 5 to 10 μm, and the surface roughness Ra (arithmetic average roughness: JIS B 0601:2001) of each of the polarization positive surface 2a and the polarization ground surface 2b was about 0.5 μm. The reference length of the surface roughness Ra is 10 mm. The fired body was a mixed crystal of the tetragonal crystal and the orthorhombic crystal, and primarily had a tetragonal crystal structure at a room temperature (ca. 22° C.). Sputtered Au, electrodes were formed on both the polarization, positive surface 2a and the polarization ground surface 2b, and the resulting body was immersed in silicon oil at a temperature of 25° C. to 120° C. In addition, a direct current electric field of 2 to 10 kV/mm was applied between the electrodes at an increase rate of 0.1 to 5 (kV/mm)/sec for 15 minutes so as to conduct a polarization treatment.

An electric field of 4 kV/mm was applied to the resulting piezoelectric/electrostrictive device (Examples 1 to 3), and distortion factors of both surfaces (the polarization positive surface 2a and the polarization ground surface 2b) of the sample were measured. Both the polarization positive surface 2a and the polarization ground surface 2b shrunk by application of the electric field. The distortion factor of the surface (the polarization positive surface 2a) was 0 to 200 ppm, and the distortion factor of the back (the polarization ground surface 2b) was 850 to 1,000 ppm, and a sample exhibiting a large difference in distortion factor was obtained. The difference in distortion factor between the surface and the back is shown in Table 1.

Comparative Examples 1 to 3

Piezoelectric/electrostrictive devices (Comparative examples 1 to 3) were immersed in silicon oil at a temperature of 25° C. to 120° C., a polarization treatment was conducted, and the distortion factors were measured by an operation as in the above-described Examples 1 to 3. The average grain size in Comparative example 1, the surface roughness in Comparative example 2, and the electric field increase rate during polarization in Comparative example 3 were out of the range specified in Examples 1 to 3. The difference in distortion factor when an electric field of 4 kV/mm was applied to the resulting piezoelectric/electrostrictive device (Comparative examples 1 to 3) is shown in Table 1.

TABLE 1

|  | Average grain size (μm) | Surface roughness Ra (μm) | Electric field increase rate during polarization ((kV/mm)/sec) | Polarization electric field (kV/mm) | Amount of warp after polarization (μm) | Difference in distortion factor between surface and back (ppm) |
|---|---|---|---|---|---|---|
| Example 1 | 5 | 0.5 | 1 | 5 | 8 | 850 |
| Example 2 | 5 | 0.5 | 0.1 | 5 | 4 | 780 |
| Example 3 | 5 | 0.5 | 5 | 5 | 6 | 820 |
| Comparative example 1 | 20 | 0.5 | 1 | 5 | 0 | 10 |
| Comparative example 2 | 5 | 2 | 1 | 5 | 0.3 | 50 |
| Comparative example 3 | 5 | 0.5 | 50 | 5 | 0.1 | 30 |

Figure 5:
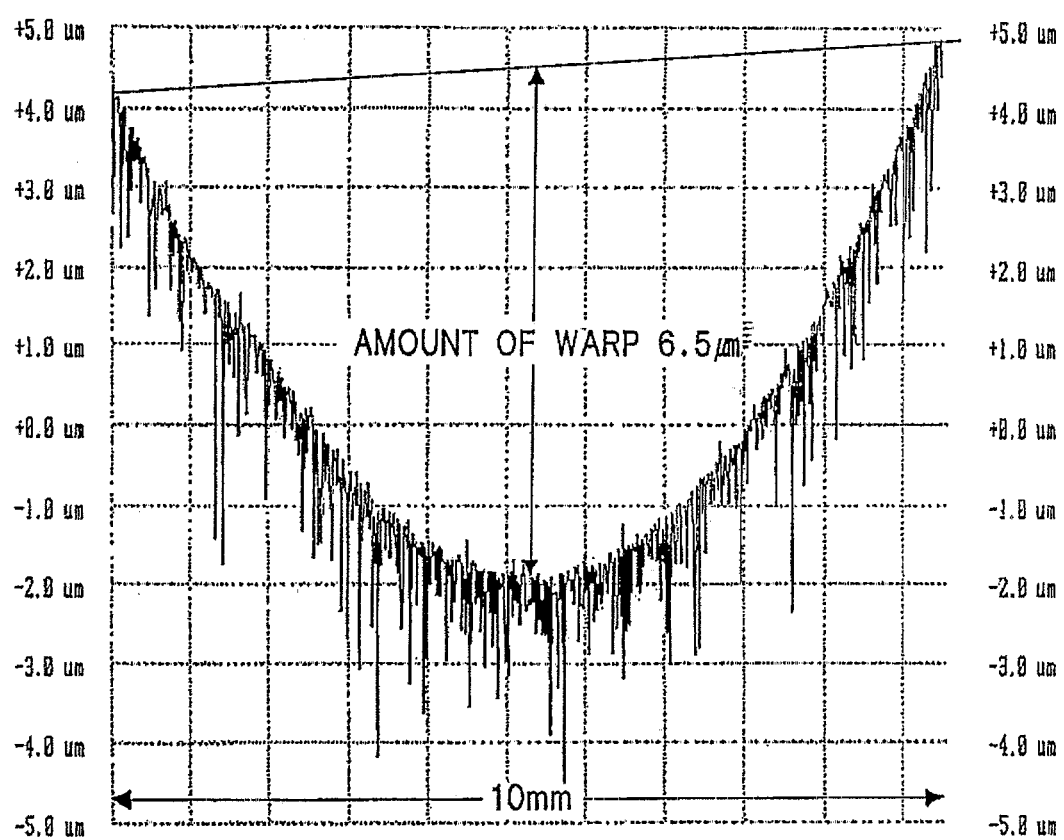
FIG. 5 is a diagram for explaining the definition of the amount of warp.

With respect to the amount of warp shown in Table 1, as shown in FIG. 5, the sample after the polarization was set with the polarization positive surface 2a side facing upward, the shape of 10-mm length in a direction of the long side (the 12-mm direction in the shape of 12 mm×3 mm×1 mm) was measured with a surface roughness meter, and the distance between a line connecting the both ends of the resulting concave profile and the bottom of the profile was determined to be the amounts of warp. The amount of warp after the polarization in Examples 1 to 3 were larger than those in Comparative examples 1 to 3.

With respect to Comparative examples 1 to 3, the differences in distortion factor between the surface and the back when an electric field of 4 kV/mm was applied were 10 to 30 ppm. On the other hand with respect to Examples 1 to 3, the differences in distortion factor were 780 to 850 ppm, which means the distortion factors of the surface and the back differ significantly.

Examples 4 to 18, Comparative Examples 4 to 11

The distortion factor of the piezoelectric/electrostrictive device was measured by an operation as in the above-described Examples 1 to 3, where the electric field increase rate during polarization and the polarization electric field were changed.

TABLE 2

|  | Average grain size (μm) | Surface roughness Ra (μm) | Electric field increase rate during polarization ((kV/mm)/sec) | Polarization electric field (kV/mm) | Amount of warp after polarization (μm) | Difference in distortion factor between surface and back (ppm) |
|---|---|---|---|---|---|---|
| Example 4 | 5 | 0.5 | 1 | 2 | 5 | 650 |
| Example 5 | 5 | 0.5 | 0.1 | 2 | 6 | 640 |
| Example 6 | 5 | 0.5 | 5 | 2 | 4 | 680 |
| Example 7 | 5 | 0.5 | 1 | 7 | 7 | 815 |
| Example 8 | 5 | 0.5 | 0.1 | 7 | 5 | 705 |
| Example 9 | 5 | 0.5 | 5 | 7 | 7 | 800 |
| Example 10 | 5 | 0.5 | 1 | 10 | 7 | 860 |
| Example 11 | 5 | 0.5 | 0.1 | 10 | 9 | 770 |
| Example 12 | 5 | 0.5 | 5 | 10 | 6 | 810 |
| Example 13 | 5 | 0.5 | 0.5 | 5 | 5 | 790 |
| Example 14 | 5 | 0.5 | 2 | 5 | 7 | 830 |
| Example 15 | 5 | 0.5 | 4 | 5 | 6 | 800 |
| Example 16 | 3 | 0.5 | 1 | 5 | 8 | 850 |
| Example 17 | 3 | 0.5 | 0.1 | 5 | 4 | 780 |
| Example 18 | 3 | 0.5 | 5 | 5 | 6 | 820 |
| Comparative example 4 | 5 | 0.5 | 1 | 12 | — (broken) | — (broken) |
| Comparative example 5 | 5 | 0.5 | 0.1 | 12 | — (broken) | — (broken) |
| Comparative example 6 | 5 | 0.5 | 5 | 12 | — (broken) | — (broken) |
| Comparative example 7 | 5 | 0.5 | 1 | 1 | 0.2 | 100 |
| Comparative example 8 | 5 | 0.5 | 0.1 | 1 | 0.5 | 20 |
| Comparative example 9 | 5 | 0.5 | 5 | 1 | 0.4 | 20 |
| Comparative example 10 | 5 | 0.5 | 0.05 | 5 | 0 | 10 |
| Comparative example 11 | 5 | 0.5 | 10 | 5 | 0.8 | 70 |

In Examples 4 to 18, the polarization electric field was changed in the range of 2 to 10 kV/mm. The difference in distortion factor was large in every case. However, with respect to Comparative examples 4 to 6 in which the polarization electric field was 12 kV/mm, the samples were broken, and with respect to Comparative examples 7 to 9 in, which the polarization electric field was 1 kV/mm, they did not exhibit a very large difference in distortion factor. Likewise, with respect to Comparative example 10 in which the electric field increase rate during polarization was decreased to 0.05 (kv/mm)/sec and Comparative example 11 in which the electric field increase rate during polarization was increased to 10 (kV/mm)/sec, they did not exhibit a very large difference in distortion factor. Therefore, it was shown that a desirable electric field increase rate during polarization was 0.1 to 5 (kV/mm)/sec and a desirable polarization electric field was 2 to 10 kV/mm.

Examples 19 to 24, Comparative Example 12

Samples with the different average grain size were prepared, and similar measurements were conducted.

TABLE 3

|  | Average grain size (μm) | Surface roughness Ra (μm) | Electric field increase rate during polarization ((kV/mm)/sec) | Polarization electric field (kV/mm) | Amount of warp after polarization (μm) | Difference in distortion factor between surface and back (ppm) |
|---|---|---|---|---|---|---|
| Example 19 | 3 | 0.5 | 0.1 | 5 | 5 | 720 |
| Example 20 | 3 | 0.5 | 1 | 5 | 7 | 730 |
| Example 21 | 3 | 0.5 | 5 | 5 | 8 | 760 |
| Example 22 | 10 | 0.5 | 0.1 | 5 | 4 | 790 |
| Example 23 | 10 | 0.5 | 1 | 5 | 5 | 810 |
| Example 24 | 10 | 0.5 | 5 | 5 | 6 | 860 |
| Comparative example 12 | 0.5 | 0.5 | 1 | 5 | 0.5 | 60 |

With respect to Examples 19 to 24 in which the average grain sizes were in the range of 3 to 10 µm, they exhibited a large difference in distortion factor in every case. On the other hand, with respect to Comparative example 12 in which the average grain size was 0.5 µm, a large difference in distortion factor was not exhibited.

Examples 25 to 30

Samples with the different average grain size and the different surface roughness were prepared, and similar measurements were conducted.

TABLE 4

|  | Average grain size (µm) | Surface roughness Ra (µm) | Electric field increase rate during polarization ((kV/mm)/sec) | Polarization electric field (kV/mm) | Amount of warp after polarization (µm) | Difference in distortion factor between surface and back (ppm) |
| --- | --- | --- | --- | --- | --- | --- |
| Example 25 | 3 | 0.2 | 1 | 5 | 5 | 580 |
| Example 26 | 3 | 1 | 1 | 5 | 7 | 750 |
| Example 27 | 5 | 0.2 | 1 | 5 | 6 | 730 |
| Example 28 | 5 | 1 | 1 | 5 | 5 | 780 |
| Example 29 | 10 | 0.2 | 1 | 5 | 4 | 820 |
| Example 30 | 10 | 1 | 1 | 5 | 4 | 880 |

With respect to Examples 25 to 30 in which the average grain sizes were 3 to 10 µm and the surface roughness was 0.2 to 1 µm, a large difference in distortion factor was exhibited in every case.

In other words, the monomorph type piezoelectric/electrostrictive device, wherein the shape after the polarization treatment is a curved shape, and the distortion factors of the surface and the back of the sample are different from each other, was obtained by specifying the grain size, the surface roughness, and the polarization treatment condition. The reason for this is estimated that polarization of the sample prepared under the condition specified within the above-described range is allowed to proceed merely up to some midpoint in the thickness direction.

As described above, the piezoelectric/electrostrictive body having the aforementioned average grain size and the surface roughness is subjected to a polarization treatment by an application of an electric field at a predetermined increase rate and, thereby, a piezoelectric/electrostrictive body, which takes on a curved shape in a state without an electric field application after the polarization and which takes on a planar shape when an electric field is applied, can be produced. That is, a monomorph type piezoelectric/electrostrictive device can be produced without joining to a different type of material or using a compositionally gradient material.

The monomorph type piezoelectric/electrostrictive device of the present invention exhibits excellent piezoelectric/electrostrictive characteristics and is suitably used in actuators, sensors, and the like.

What is claimed is:

1. A piezoelectric/electrostrictive device comprising a monomorph piezoelectric/electrostrictive crystalline body, wherein (i) said piezoelectric/electrostrictive body is lead-free and contains at least Nb, Ta, and one or more types of alkali metal element, ( ii) said piezoelectric/electrostrictive crystalline body has a cubic crystal structure at a temperature higher than a phase transition point and at least any one of tetragonal and orthorhombic crystal structures at a temperature lower than the phase transition point, and (iii) said piezoelectric/electrostrictive crystalline body has a curved shape having a degree of curving larger than that before a polarization treatment at a room temperature lower than the phase transition point, when the piezoelectric/electrostrictive crystalline body is subjected to the polarization treatment.

2. The piezoelectric/electrostrictive device according to claim 1, wherein said piezoelectric/electrostrictive body has a different distortion factor between a first main surface which is an end surface in the thickness direction and a second main surface opposite to the first main surface.

3. A method for manufacturing a piezoelectric/electrostrictive device comprising a monomorph piezoelectric/electrostrictive crystalline body, wherein (i) said piezoelectric/electrostrictive body is lead-free and contains at least Nb, Ta, and one or more types of alkali metal element, (ii) said piezoelectric/electrostrictive crystalline body has a cubic crystal structure at a temperature higher than a phase transition point and at least any one of tetragonal and orthorhombic crystal structures at a temperature lower than the phase transition point, and (iii) said piezoelectric/electrostrictive crystalline body has a curved shape having a degree of curving larger than that before a polarization treatment at a room temperature lower than the phase transition point, when the piezoelectric/electrostrictive crystalline body is subjected to the polarization treatment, said method comprising the step of subjecting the piezoelectric/electrostrictive body to a polarization treatment wherein a maximum electric field is applied, with increasing an electric field at an electric field increasing speed of from 0.1 (kV/mm)/sec or more to 5 (kV/mm)/sec or less while keeping a maximum electric field at a level of from 2 kV/mm or more to 10 kV/mm or less.

4. The method according to claim 3, wherein said piezoelectric/electrostrictive body has a different distortion factor between a first main surface which is an end surface in the thickness direction and a second main surface opposite to the first main surface.

* * * * *